(12) United States Patent
Tung et al.

(10) Patent No.: US 12,069,834 B2
(45) Date of Patent: Aug. 20, 2024

(54) HEAT DISSIPATION SYSTEM AND ELECTRONIC DEVICE

(71) Applicants: Inventec (Pudong) Technology Corporation, Shanghai (CN); INVENTEC CORPORATION, Taipei (TW)

(72) Inventors: Kai-Yang Tung, Taipei (TW); Hung-Ju Chen, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 220 days.

(21) Appl. No.: 17/839,704

(22) Filed: Jun. 14, 2022

(65) Prior Publication Data

US 2023/0071588 A1 Mar. 9, 2023

(30) Foreign Application Priority Data

Sep. 7, 2021 (CN) .......................... 202111045244.8
Sep. 7, 2021 (CN) .......................... 202111045258.X

(51) Int. Cl.
H05K 7/20 (2006.01)

(52) U.S. Cl.
CPC ......... *H05K 7/20327* (2013.01); *H05K 7/203* (2013.01); *H05K 7/20318* (2013.01); *H05K 7/20818* (2013.01)

(58) Field of Classification Search
CPC ............... H05K 7/20327; H05K 7/203; H05K 7/20318; H05K 7/20818

USPC ...................................................... 361/679.53
See application file for complete search history.

(56) References Cited

U.S. PATENT DOCUMENTS

| 4,156,458 | A | * | 5/1979 | Chu | ....................... | H01L 23/473 |
|---|---|---|---|---|---|---|
| | | | | | | 257/E23.098 |
| 4,226,281 | A | * | 10/1980 | Chu | ....................... | H01L 23/473 |
| | | | | | | 257/713 |
| 5,023,695 | A | * | 6/1991 | Umezawa | ........... | H01L 23/4735 |
| | | | | | | 257/714 |
| 5,285,351 | A | * | 2/1994 | Ikeda | ..................... | H01L 23/433 |
| | | | | | | 257/E23.09 |
| 5,349,831 | A | * | 9/1994 | Daikoku | ............... | H01L 23/427 |
| | | | | | | 165/80.4 |

(Continued)

*Primary Examiner* — Anatoly Vortman
(74) *Attorney, Agent, or Firm* — Locke Lord LLP; Tim Tingkang Xia, Esq.

(57) ABSTRACT

A heat dissipation system and an electronic device. The heat dissipation system configured to circulate working fluid and to cool heat source. Heat dissipation system includes casing, first tube, second tube, condenser and flow rate controller. Partition is fixed in the base and is located in the accommodation space to divide the accommodation space into a first and a second accommodation space. The first accommodation space is located above the second accommodation space along a gravitational direction. The inlet is in fluid communication with the first accommodation space. The outlet is in fluid communication with the second accommodation space. The partition includes a plurality of drip holes. The first and the second accommodation spaces are in fluid communication with each other via the drip holes. The working fluid is configured to drip onto the heat source via the plurality of drip holes.

17 Claims, 3 Drawing Sheets

(56) References Cited

U.S. PATENT DOCUMENTS

| | | | | |
|---|---|---|---|---|
| 7,000,684 B2* | 2/2006 | Kenny | ............... | H01L 23/473 |
| | | | | 174/15.1 |
| 7,133,286 B2* | 11/2006 | Schmidt | ............ | H01L 23/473 |
| | | | | 361/698 |
| 8,059,405 B2* | 11/2011 | Campbell | ................ | F28F 3/02 |
| | | | | 361/679.53 |
| 8,953,320 B2* | 2/2015 | Campbell | ............ | F28D 15/046 |
| | | | | 165/185 |
| 9,009,971 B2* | 4/2015 | Campbell | ............ | H05K 7/203 |
| | | | | 361/689 |
| 9,095,942 B2* | 8/2015 | Campbell | ............ | H05K 7/203 |
| 9,812,377 B2* | 11/2017 | Yamada | ............ | H01L 23/473 |
| 10,416,736 B2* | 9/2019 | Dupont | ............ | H05K 7/20936 |
| 11,839,053 B2* | 12/2023 | Wu | ................ | H05K 7/20318 |
| 2008/0002364 A1* | 1/2008 | Campbell | ............ | H05K 7/2079 |
| | | | | 361/699 |
| 2014/0218858 A1* | 8/2014 | Shelnutt | ............... | H05K 7/203 |
| | | | | 361/679.31 |
| 2014/0218859 A1* | 8/2014 | Shelnutt | ............ | H05K 7/20809 |
| | | | | 361/679.46 |
| 2019/0364691 A1* | 11/2019 | Subrahmanyam | ............ | |
| | | | | H05K 7/20518 |
| 2021/0348624 A1* | 11/2021 | Diglio | ............... | F04D 29/588 |
| 2022/0248558 A1* | 8/2022 | Lin | ............ | H05K 7/203 |
| 2023/0070643 A1* | 3/2023 | Tung | ............ | F25B 39/04 |
| 2023/0071588 A1* | 3/2023 | Tung | ............... | H05K 7/20809 |
| 2023/0156960 A1* | 5/2023 | Ramakrishnan | ... | H05K 7/20327 |
| | | | | 361/679.53 |

* cited by examiner

HEAT DISSIPATION SYSTEM AND ELECTRONIC DEVICE

CROSS-REFERENCE TO RELATED APPLICATIONS

This non-provisional application claims priority under 35 U.S.C. § 119(a) on Patent Application No(s). 202111045244.8 filed in China, on Sep. 7, 2021, and on Patent Application No(s). 202111045258.X filed in China, on Sep. 7, 2021, the entire contents of which are hereby incorporated by reference.

BACKGROUND OF THE INVENTION

Technical Field of the Invention

The invention relates to a heat dissipation system and an electronic device, more particularly to a heat dissipation system and an electronic device including at least one flow rate controller.

Description of the Related Art

In some types of immersion cooling systems, the dielectric liquid drips onto the heat source in a server through one or more drip holes via gravity. In this way, the heat source is immersed in the dielectric liquid and the dielectric liquid effectively absorbs the heat generated by the heat source and thus evaporates into gas. Since the heat source generates different amounts of heat under different levels of loadings, the amount of the dielectric liquid dripping onto the heat source is usually determined by the amount of heat generated by the heat source under high loading. Also, in order to prevent the movement of the bubbles generated as the dielectric liquid evaporates from being disturbed because the servers are arranged in parallel to the gravitational direction, the servers are usually arranged along a direction that is perpendicular to the gravitational direction in the immersion cooling system.

However, when the heat source is under low loading, the amount of the dielectric liquid dripping into the server is excessive and thus some of the dielectric liquid may hardly evaporate into gas. Although the heat source has small volume relative to the entire server, the dielectric liquid should fill the entire server to immerse the heat source, and thus a large amount of the dielectric liquid is required, which increases the cost spending on it. Also, most of the dielectric liquid accumulates in the server is not evaporated into gas and thus absorbs the heat generated by the heat source merely through natural convection in a liquid state, which significantly reduces the heat transferring efficiency between the dielectric liquid and the heat source. In addition, servers are usually arranged along a direction parallel to the gravitational direction in a general cabinet via slide rails. Thus, the servers arranged along a direction perpendicular to the gravitational direction are unable to be installed in a general cabinet via slide rails, and due to this, it is required to use tools to move such servers during maintenance.

SUMMARY OF THE INVENTION

The invention provides a heat dissipation system and an electronic device that control the amount of the working fluid flowing into the casing to ensure the working fluid to efficiently absorb the heat generated by the heat source via phase change.

One embodiment of this invention provides a heat dissipation system configured to circulate a working fluid and to cool a heat source. The heat dissipation system includes a casing, a first tube, a second tube, a condenser and a flow rate controller. The casing includes a base and a partition. The base includes an accommodation space, an inlet and an outlet. The partition is fixed in the base and is located in the accommodation space to divide the accommodation space into a first accommodation space and a second accommodation space. The first accommodation space is located above the second accommodation space along a gravitational direction. The inlet is in fluid communication with the first accommodation space. The outlet is in fluid communication with the second accommodation space. The partition includes a plurality of drip holes. The first accommodation space and the second accommodation space are in fluid communication with each other via the plurality of drip holes. The heat source is configured to be located in the second accommodation space. The working fluid is configured to drip onto the heat source via the plurality of drip holes. An end of the first tube is in fluid communication with the inlet. An end of the second tube is in fluid communication with the outlet. The first tube is in fluid communication with the second tube via the condenser. The flow rate controller is disposed on the first tube.

Another embodiment of this invention provides an electronic device configured to circulate a working fluid. The electronic device includes a casing, a first tube, a second tube, a condenser, a flow rate controller, a first heat source and a second heat source. The casing includes a base and a partition. The base includes an accommodation space, an inlet and an outlet. The partition is fixed in the base and is located in the accommodation space to divide the accommodation space into a first accommodation space and a second accommodation space. The first accommodation space is located above the second accommodation space along a gravitational direction. The inlet is in fluid communication with the first accommodation space. The outlet is in fluid communication with the second accommodation space. The partition comprises a plurality of drip holes. The first accommodation space and the second accommodation space are in fluid communication with each other via the plurality of drip holes. An end of the first tube is in fluid communication with the inlet. An end of the second tube is in fluid communication with the outlet. The first tube is in fluid communication with the second tube via the condenser. The flow rate controller is disposed on the first tube. The first heat source is located in the second accommodation space of the base. The working fluid is configured to drip onto the first heat source via the plurality of drip holes. The second heat source is located in the second accommodation space of the base and spaced apart from the first heat source. The working fluid is configured to drip onto the second heat source via the plurality of drip holes.

According to the heat dissipation system and the electronic device disclosed by above embodiments, since the flow rate controller is disposed on the first tube, the flow rate controller controls the flow rate of the working fluid flowing into the first accommodation space from the inlet, thereby controlling the amount of the working fluid dripping onto the heat source via the drip holes. Thus, the flow rate controller is able to increase or decrease the flow rate of the working fluid flowing into the first accommodation space according to actual requirements. Therefore, the waste of the working fluid is reduced to decrease the cost spending on the working fluid, and the flow rate of the working fluid is enough to efficiently cool the heat source.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
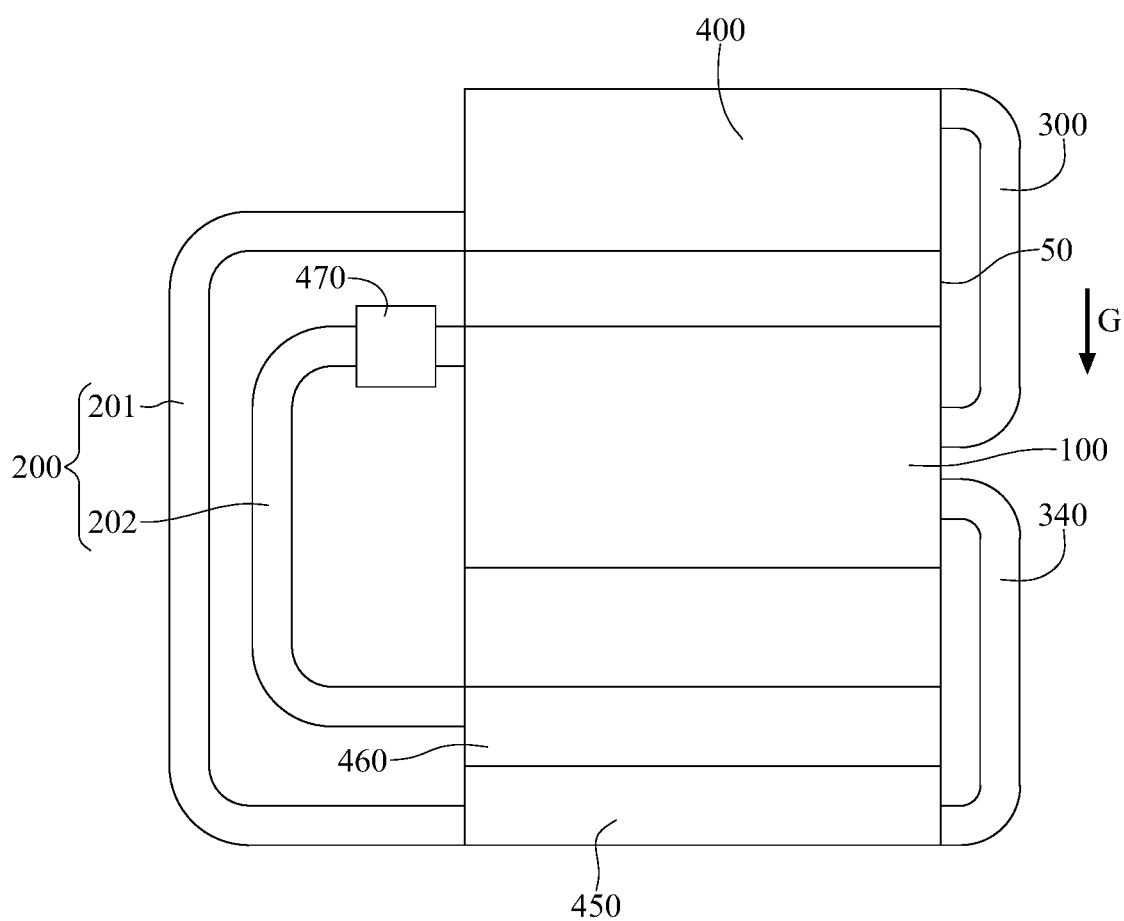
FIG. 1 is a schematic side view of an electronic device according a first embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
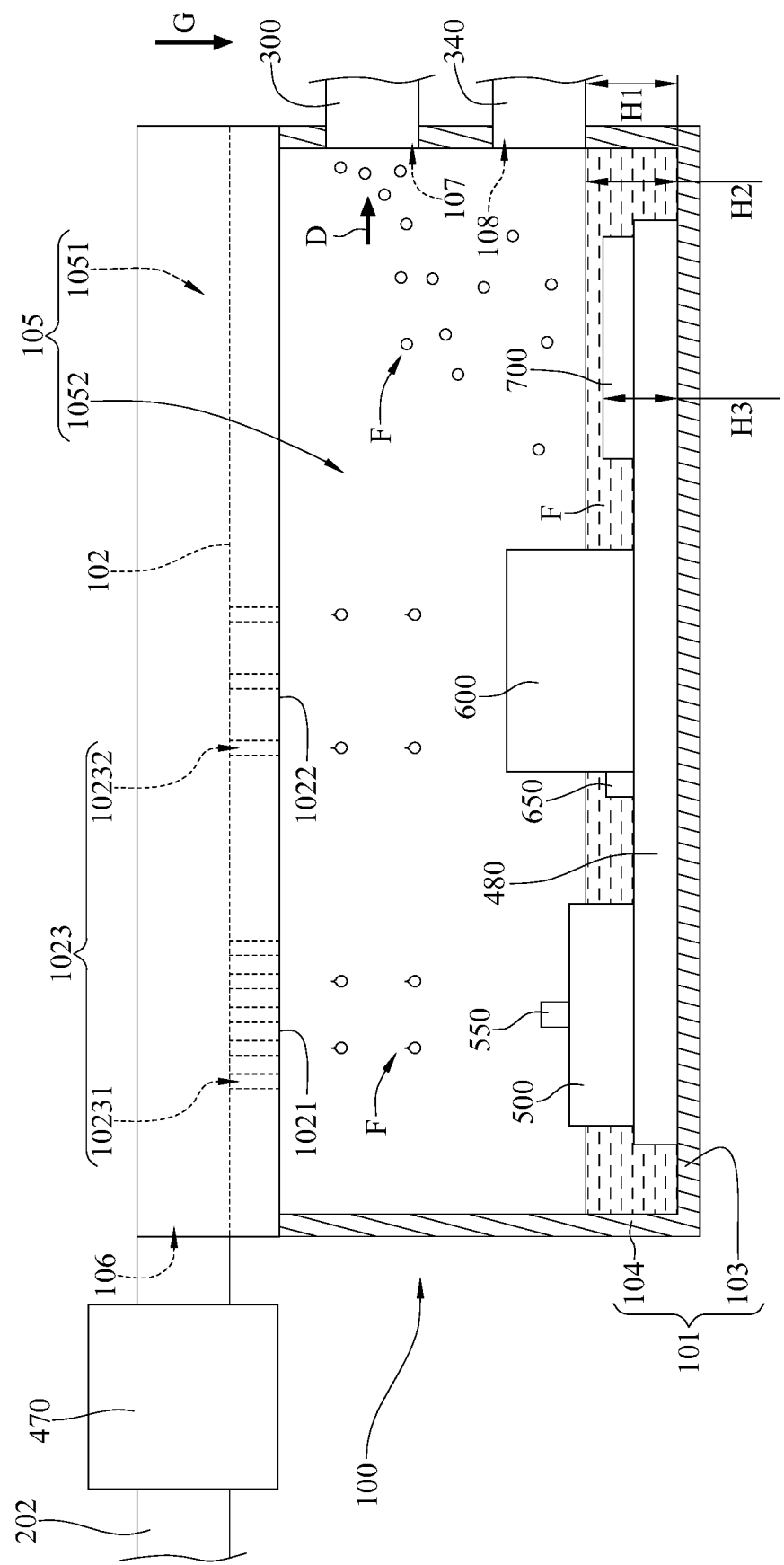
FIG. 2 is a side cross-sectional view of the electronic device in FIG. 1.

Please refer to FIGS. 1 and 2, where FIG. 1 is a schematic side view of an electronic device 10 according a first embodiment of the invention, and FIG. 2 is a side cross-sectional view of the electronic device 10 in FIG. 1.

The electronic device 10 is configured to circulate a working fluid F. The working fluid F is, for example, a dielectric liquid. In this embodiment, the electronic device 10 includes a cabinet 50, a casing 100, a first tube 200, a second tube 300, a third tube 340, a condenser 400, a liquid storing tank 450, a pump 460, a circuit board 480, a first heat source 500, a second heat source 600 and a third heat source 700. Note that the casing 100, the first tube 200, the second tube 300, the third tube 340, the condenser 400, the liquid storing tank 450, the pump 460 and the flow rate controller 470 may be together regarded as a heat dissipation system.

The casing 100 is disposed in the cabinet 50 and includes a base 101 and a partition 102. Also, the casing 100 is, for example, a server chassis. In this embodiment, the base 101 includes a bottom plate 103, a side plate 104, an accommodation space 105, an inlet 106, an outlet 107 and an overflow outlet 108. The side plate 104 stands on the bottom plate 103. The partition 102 is fixed to the side plate 104 and located in the accommodation space 105 so as to divide the accommodation space 105 into a first accommodation space 1051 and a second accommodation space 1052. The first accommodation space 1051 is located above the second accommodation space 1052 along a gravitational direction G. Also, the second accommodation space 1052 is formed by the bottom plate 103, the side plate 104 and the partition 102. The inlet 106 is in fluid communication with the first accommodation space 1051. The outlet 107 is located at the side plate 104 and is in fluid communication with the second accommodation space 1052. In this embodiment, the overflow outlet 108 is located at the side plate 104, and the overflow outlet 108 is located closer to the bottom plate 103 than the outlet 107. In this embodiment, a minimum height H1 of the overflow outlet 108 relative to the bottom plate 103 is equal to a predetermined liquid level H2 of the working fluid F in the second accommodation space 1052 relative to the bottom plate 103. Thus, when a liquid level of the working fluid F is higher than the predetermined liquid level H2, the working fluid F overflows out of the second accommodation space 1052 from the overflow outlet 108. In this way, the amount of the working fluid F accumulating in the second accommodation space 1052 may be controlled by the overflow outlet 108, thereby avoiding the waste of the working fluid F.

In this embodiment, the first tube 200 includes a first connection tube 201 and a second connection tube 202. Two opposite ends of the first connection tube 201 are in fluid communication with the condenser 400 and the liquid storing tank 450, respectively. Two opposite ends of the second connection tube 202 are in fluid communication with the pump 460 and the inlet 106 of the base 101, respectively. Two opposite ends of the second tube 300 are in fluid communication with the outlet 107 of the base 101 and the condenser 400, respectively. Two opposite ends of the third tube 340 are in fluid communication with the liquid storing tank 450 and the overflow outlet 108 of the base 101, respectively. In addition, in this embodiment, the condenser 400 is disposed in the cabinet 50, and the condenser 400 is located above the base 101 along the gravitational direction G. In addition, in this embodiment, the condenser 400 is disposed outside the base 101 of the casing 100. That is, the condenser 400 and the base 101 of the casing 100 is separately disposed in the cabinet 50. The liquid storing tank 450 and the pump 460 are disposed in the cabinet 50, and the liquid storing tank 450 is in fluid communication with the pump 460. In this embodiment, the flow rate controller 470 is disposed on an end of the second connection tube 202 of the first tube 200 that is in direct fluid communication with the inlet 106, and the flow rate controller 470 is, for example, a valve or a pump.

The circuit board 480 is located in the second accommodation space 1052 of the base 101. The first heat source 500, the second heat source 600 and the third heat source 700 are disposed on the circuit board 480 and are located in the second accommodation space 1052. Additionally, the first heat source 500, the second heat source 600 and the third heat source 700 are spaced apart from one another. The first temperature sensor 550 is disposed on the first heat source 500 and is configured to sense a temperature of the first heat source 500. The second temperature sensor 650 is disposed on the circuit board 480 and is located adjacent to the second heat source 600. The second temperature sensor 650 is configured to sense a temperature of the second heat source 600.

In this embodiment, the partition 102 includes a first region 1021, a second region 1022 and a plurality of drip holes 1023. The drip holes 1023 includes a plurality of first drip holes 10231 and a plurality of second drip holes 10232. The first region 1021 and the second region 1022 are spaced apart from each other. In addition, an overall area of the first region 1021 is, for example, equal to an overall area of the second region 1022. The first drip holes 10231 are located at the first region 1021. The second drip holes10232 are located at the second region 1022. The first accommodation space 1051 and the second accommodation space 1052 are in fluid communication with each other via the drip holes 1023. A porosity of the first region 1021 with the first drip holes 10231 is different from a porosity of the second region 1022 with the second drip holes 10232. Specifically, in this embodiment, a size of each first drip hole 10231 is equal to a size of each second drip holes 10232, and a quantity of the first drip holes10231 is greater than a quantity of the second drip holes 10232. Thus, in this embodiment, the porosity of the first region 1021 with the first drip holes 10231 is greater than the porosity of the second region 1022 with the second drip holes 10232. Note that the porosity of the first region

1021 with the first drip holes 10231 denotes a ratio of an overall area of the first drip holes 10231 to an overall area of the first region 1021.

Note that in other embodiments, the porosity of the first region with the first drip holes may be equal to or smaller than the porosity of the second region with the second drip holes. In addition, in other embodiments, the size of each first drip hole may be larger than the size of each second drip hole, such that the porosity of the first region with the first drip holes may be greater than the porosity of the second region with the second drip holes.

In this embodiment, the working fluid F drips onto the first heat source 500 via the first drip holes 10231, and the working fluid F drips onto the second heat source 600 via the second drip holes 10232. In this embodiment, an amount of a heat generated by the first heat source 500 is greater than an amount of a heat generated by the second heat source 600, and the porosity of the first region 1021 with the first drip holes 10231 is greater than the porosity of the second region 1022 with the second drip holes 10232. In addition, an amount of a heat generated by the third heat source 700 is smaller than the amount of the heat generated by the first heat source 500 and the amount of the heat generated by the second heat source 600. A maximum height H3 of the third heat source 700 relative to the bottom plate 103 is smaller than the predetermined liquid level H2 of the working fluid F in the second accommodation space 1052 relative to the bottom plate 103, and thus the third heat source 700 is entirely immersed in the working fluid F. Thus, there is no drop hole in a region of the partition 102 (a region of the partition 102 located above the third heat source 700 along the gravitational direction G) for the working fluid F to drip onto the third heat source 700 therethrough, the third heat source 700 is cooled merely by the working fluid F accumulating in the second accommodation space 1052. That is, in this invention, amounts of the working fluid F respectively dripping onto the first heat source 500, the second heat source 600 and the third heat source 700 are determined by the amounts of heats generated by the first heat source 500, the second heat source 600 and the third heat source 700 and the heights thereof. In other embodiments, when the amount of the heat generated by the first heat source is equal to the amount of the heat generated by the second heat source but the height of the first heat source is smaller than the height of the second heat source, the porosity of the second region with the second drip holes may be greater than the porosity of the first region with the first drip holes, such that more working fluid drips onto the second heat source than the first heat source.

The working fluid F is driven by the pump 460 so as to flow from the liquid storing tank 450 to the second connection tube 202, and the working fluid F flows into the first accommodation space 1051 via the inlet 106 after the flow rate of the working fluid F is adjusted by the flow rate controller 470. The working fluid F flowing into the first accommodation space 1051 drips onto the first heat source 500 and the second heat source 600 along the gravitational direction G via the first drip holes 10231 and the second drip holes 10232, respectively. The working fluid F accumulating in the second accommodation space 1052 immerses the third heat source 700. When the working fluid F absorbs the heats generated by the first heat source 500, the second heat source 600 and the third heat source 700 and evaporates into gas, the gaseous working fluid F flows out of the second accommodation space 1052 along a flowing direction D via the outlet 107. The gaseous working fluid F flowing out of the second accommodation space 1052 flows into the condenser 400 via the second tube 300 and is condensed into liquid by the condenser 400. Then, the liquid working fluid F flows back to the liquid storing tank 450 via the first connection tube 201.

In this embodiment, the flow rate controller 470 can be controlled based on the temperature data sensed by the first temperature sensor 550 or the second temperature sensor 650. For example, if the temperature sensed by the first temperature sensor 550 or the second temperature sensor 650 is high, the flow rate controller 470 will increase the flow rate of the working fluid F flowing into the first accommodation space 1051. If the temperature sensed by the first temperature sensor 550 or the second temperature sensor 650 is low, the flow rate controller 470 will decrease the flow rate of the working fluid F flowing into the first accommodation space 1051. Accordingly, the waste of the working fluid F is reduced so as to decrease the cost spending on the working fluid, and the flow rate of the working fluid F is enough to efficiently cool the first heat source 500 and the second heat source 600. Note that in other embodiments, the electronic device may not include the first temperature sensor 550 and the second temperature sensor 650.

Figure 3:
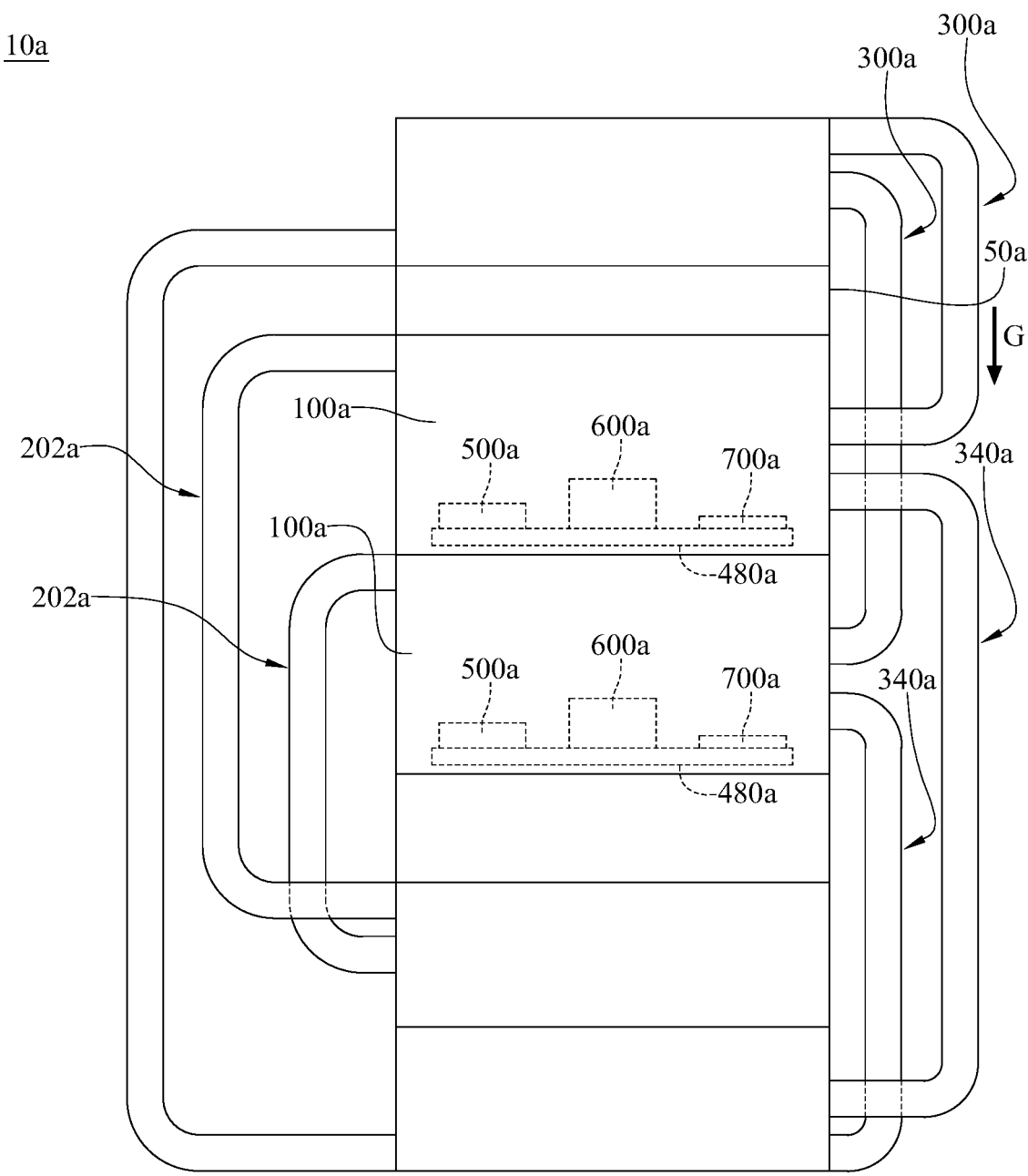
FIG. 3 is a schematic side view of an electronic device according to a second embodiment of the invention.

Please refer to FIG. 3 that is a schematic side view of an electronic device 10*a* according to a second embodiment of the invention. In this embodiment, in the electronic device 10*a*, there are two casings 100*a*, two second connection tubes 202*a*, two second tubes 300*a*, two third tubes 340*a*, two circuit boards 480*a*, two first heat sources 500*a*, two second heat sources 600*a* and two third heat sources 700*a*. The two casings 100*a* are disposed in parallel to each other in the cabinet 50*a* along the gravitational direction G, and the first heat sources 500*a*, the second heat sources 600*a* and the third heat sources 700*a* respectively disposed on the two circuit boards 480*a* are cooled in two independent spaces that are not in fluid communication with each other, respectively. Thus, the two casings 100*a* each configured as a server chassis are able to be disposed in an existing cabinet 50*a* including one or more slide rails (not shown), thereby facilitating the maintenance of the electronic components in the casing 100*a*. Also, the working fluid can efficiently cool the first heat sources 500*a*, the second heat sources 600*a* and the third heat sources 700*a* via independent spaces. Other details of the electronic device 10*a* according to this embodiment may be understood by the descriptions related to FIGS. 1 to 3 and thus the descriptions thereof are omitted.

According to the heat dissipation system and the electronic device disclosed by above embodiments, since the flow rate controller is disposed on the first tube, the flow rate controller controls the flow rate of the working fluid flowing into the first accommodation space from the inlet, thereby controlling the amount of the working fluid dripping onto the heat source via the drip holes. Thus, the flow rate controller is able to increase or decrease the flow rate of the working fluid flowing into the first accommodation space according to actual requirements. Therefore, the waste of the working fluid is reduced to decrease the cost spending on the working fluid, and the flow rate of the working fluid is enough to efficiently cool the heat source. In addition, since different regions with the drip holes have different porosities, the amount of working fluid dripped onto the heat sources can be determined according to the amounts of the heats generated by the heat sources. In this way, the waste of the working fluid is reduced while allowing the heat sources to be efficiently cooled.

Moreover, since the condenser is located above the base along the gravitational direction, the gaseous working fluid in the condenser is smoothly flowing back to the liquid storing tank, thereby increasing the heat transfer efficiency between the working fluid and the heat source.

In an embodiment of the invention, the heat dissipation system and the electronic device according to the invention may be applied to a server, and the said server may apply Artificial Intelligence (AI) computing, Edge Computing or may be used as a 5G server, a cloud server or a Vehicle-to-everything (V2X) server.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A heat dissipation system, configured to circulate a working fluid and to cool a heat source, the heat dissipation system comprising:
    a casing, comprising a base and a partition, wherein the base comprises an accommodation space, an inlet and an outlet, the partition is fixed in the base and is located in the accommodation space to divide the accommodation space into a first accommodation space and a second accommodation space, the first accommodation space is located above the second accommodation space along a gravitational direction, the inlet is in fluid communication with the first accommodation space, the outlet is in fluid communication with the second accommodation space, the partition comprises a plurality of drip holes, the first accommodation space and the second accommodation space are in fluid communication with each other via the plurality of drip holes, the heat source is located in the second accommodation space, and the working fluid is configured to drip onto the heat source via the plurality of drip holes;
    a first tube, wherein an end of the first tube is in fluid communication with the inlet;
    a second tube, wherein an end of the second tube is in fluid communication with the outlet;
    a condenser, wherein the first tube is in fluid communication with the second tube via the condenser; and
    a flow rate controller, disposed on the first tube.

2. The heat dissipation system according to claim 1, further comprising a liquid storing tank and a pump that are in fluid communication with each other, wherein the first tube comprises a first connection tube and a second connection tube, two opposite ends of the first connection tube are in fluid communication with the condenser and the liquid storing tank, respectively, two opposite ends of the second connection tube are in fluid communication with the pump and the inlet of the base of the casing, respectively, and the flow rate controller is disposed on the second connection tube.

3. The heat dissipation system according to claim 2, wherein the flow rate controller is disposed on an end of the second connection tube that is in fluid communication with the inlet.

4. The heat dissipation system according to claim 1, wherein the heat source further comprise a first heat source and a second heat source, the partition comprises a first region and a second region, the plurality of drip holes comprise at least one first drip hole and at least one second drip hole, the first region and the second region are spaced apart from each other, the at least one first drip hole is located at the first region, the at least one second drip hole is located at the second region, the first heat source and the second heat source are located in the second accommodation space and spaced apart from each other, the working fluid is configured to drip onto the first heat source via the at least one first drip hole and is configured to drip onto the second heat source via the at least one second drip hole.

5. The heat dissipation system according to claim 4, wherein a porosity of the first region with the at least one first drip hole is different from a porosity of the second region with the at least one second drip hole.

6. The heat dissipation system according to claim 1, wherein the base further comprises a bottom plate and a side plate, the side plate stands on the bottom plate, the side plate, the bottom plate and the partition form the second accommodation space, and the outlet is located on the side plate.

7. The heat dissipation system according to claim 6, wherein the base further comprises an overflow outlet, the overflow outlet is located at the side plate, and the overflow outlet is located closer to the bottom plate than the outlet.

8. The heat dissipation system according to claim 7, wherein a minimum height of the overflow outlet relative to the bottom plate is equal to a predetermined liquid level of the working fluid in the second accommodation space relative to the bottom plate.

9. The heat dissipation system according to claim 1, further comprising a cabinet, wherein the base of the casing is disposed in the cabinet, the condenser is disposed in the cabinet, and the condenser is located above the base along the gravitational direction.

10. An electronic device, configured to circulate a working fluid, the electronic device comprising:
    a casing, comprising a base and a partition, wherein the base comprises an accommodation space, an inlet and an outlet, the partition is fixed in the base and is located in the accommodation space to divide the accommodation space into a first accommodation space and a second accommodation space, the first accommodation space is located above the second accommodation space along a gravitational direction, the inlet is in fluid communication with the first accommodation space, the outlet is in fluid communication with the second accommodation space, the partition comprises a plurality of drip holes, the first accommodation space and the second accommodation space are in fluid communication with each other via the plurality of drip holes;
    a first tube, wherein an end of the first tube is in fluid communication with the inlet;
    a second tube, wherein an end of the second tube is in fluid communication with the outlet;
    a condenser, wherein the first tube is in fluid communication with the second tube via the condenser;
    a flow rate controller, disposed on the first tube;
    a first heat source, located in the second accommodation space of the base, wherein the working fluid is configured to drip onto the first heat source via the plurality of drip holes; and
    a second heat source, located in the second accommodation space of the base and spaced apart from the first heat source, wherein the working fluid is configured to drip onto the second heat source via the plurality of drip holes.

11. The electronic device according to claim 10, further comprising a first temperature sensor disposed on the first heat source and configured to sense a temperature of the first heat source.

12. The electronic device according to claim 10, further comprising a circuit board and a second temperature sensor, wherein the circuit board is located in the second accommodation space, the first heat source and the second heat source are disposed on the circuit board and are spaced apart from each other, the second temperature sensor is disposed on the circuit board and located adjacent to the second heat source, and the second temperature sensor is configured to sense a temperature of the second heat source.

13. The electronic device according to claim 10, wherein the base further comprises a bottom plate and a side plate, the side plate stands on the bottom plate, the bottom plate, the side plate and the partition form the second accommodation space, and a maximum height of the first heat source relative to the bottom plate is greater than a maximum height of the second heat source relative to the bottom plate.

14. The electronic device according to claim 10, wherein the plurality of drip holes comprise at least one first drip hole and at least one second drip hole, the partition comprises a first region and a second region, the first region and the second region are spaced apart from each other, the at least one first drip hole is located at the first region, the at least one second drip hole is located at the second region.

15. The electronic device according to claim 14, wherein a porosity of the first region with the at least one first drip hole is different from a porosity of the second region with the at least one second drip hole.

16. The electronic device according to claim 15, wherein the porosity of the first region with the at least one first drip hole is greater than the porosity of the second region with the at least one second drip hole.

17. The electronic device according to claim 10, further comprising a third heat source, wherein the base further comprises a bottom plate and a side plate, the side plate stands on the bottom plate, the side plate, the bottom plate and the partition form the second accommodation space, the third heat source is located in the second accommodation space and is spaced apart from the first heat source and the second heat source, a maximum height of the third heat source relative to the bottom plate is smaller than a predetermined liquid level of the working fluid in the second accommodation space relative to the bottom plate, the working fluid dripping onto the first heat source and the second heat source is configured to accumulate in the second accommodation space to cool the third heat source.

* * * * *